(12) United States Patent
Brewer et al.

(10) Patent No.: US 9,524,872 B1
(45) Date of Patent: Dec. 20, 2016

(54) HETEROGENEOUS INTEGRATED CIRCUITS AND DEVICES THEREOF WITH A SURROGATE SUBSTRATE AND TRANSFERRED SEMICONDUCTOR DEVICES

(75) Inventors: Peter D. Brewer, Westlake Village, CA (US); Andrew T. Hunter, Woodland Hills, CA (US); Yakov Royter, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 645 days.

(21) Appl. No.: 13/096,780

(22) Filed: Apr. 28, 2011

Related U.S. Application Data

(62) Division of application No. 12/365,112, filed on Feb. 3, 2009, now Pat. No. 7,972,936.

(51) Int. Cl.
*H01L 21/30* (2006.01)
*H01L 21/18* (2006.01)

(52) U.S. Cl.
CPC ............ *H01L 21/185* (2013.01); *H01L 21/18* (2013.01); *H01L 21/187* (2013.01)

(58) Field of Classification Search
USPC .......................... 438/406, 455, 456, 458, 459
See application file for complete search history.

(56) References Cited

U.S. PATENT DOCUMENTS

| 4,127,932 | A | * | 12/1978 | Hartman et al. | 438/58 |
|---|---|---|---|---|---|
| 5,077,231 | A | | 12/1991 | Plumton et al. | |
| 5,166,083 | A | * | 11/1992 | Bayraktaroglu | 438/170 |
| 5,243,207 | A | * | 9/1993 | Plumton et al. | 257/192 |
| 5,410,175 | A | * | 4/1995 | Kyomasu et al. | 257/458 |
| 5,422,501 | A | | 6/1995 | Bayraktaroglu | |
| 5,920,230 | A | * | 7/1999 | Beall | 330/54 |
| 7,655,529 | B1 | * | 2/2010 | Chen et al. | 438/312 |
| 7,989,277 | B1 | * | 8/2011 | Luh et al. | 438/167 |
| 2002/0017644 | A1 | * | 2/2002 | Fitzgerald | 257/69 |
| 2003/0017683 | A1 | * | 1/2003 | Emrick et al. | 438/478 |
| 2003/0170965 | A1 | * | 9/2003 | Kondo | 438/455 |
| 2003/0219952 | A1 | * | 11/2003 | Fujimaki | 438/322 |
| 2004/0041174 | A1 | * | 3/2004 | Okihara | 257/200 |
| 2005/0184310 | A1 | * | 8/2005 | Krutko et al. | 257/197 |

(Continued)

OTHER PUBLICATIONS

Wu et al., InP HBT/GaN HEMT/Si CMOS Heterogeneous Integrated Q-Band VCO-Amplifier Chain, 2015 IEEE Radio Frequency Integrated Circuits Symposium, p. 39 (2015).*

*Primary Examiner* — Peter Bradford
(74) *Attorney, Agent, or Firm* — Lewis Roca Rothgerber Christie LLP

(57) ABSTRACT

A heterogeneous integrated circuit and method of making the same. An integrated circuit includes a surrogate substrate including a material selected from the group consisting of Group II, Group III, Group IV, Group V, and Group VI materials and their combinations; at least one active semiconductor device including a material combination selected from the group consisting of Group IV-IV, Group III-V and Group II-VI materials; and at least one transferred semiconductor device including a material combination selected from the group consisting of Group IV-IV, Group III-V and Group II-VI materials. The at least one active semiconductor device and the at least one transferred device are interconnected.

17 Claims, 5 Drawing Sheets

(56) References Cited

U.S. PATENT DOCUMENTS

| | | | |
|---|---|---|---|
| 2005/0269687 A1* | 12/2005 | Forcier | 257/701 |
| 2006/0127022 A1* | 6/2006 | Kim et al. | 385/129 |
| 2006/0220031 A1* | 10/2006 | Krames et al. | 257/79 |
| 2006/0226415 A1* | 10/2006 | Nishijima et al. | 257/11 |
| 2006/0284213 A1* | 12/2006 | Shigematsu et al. | 257/197 |
| 2007/0018269 A1* | 1/2007 | Rhodes | 257/458 |
| 2007/0228416 A1* | 10/2007 | Chen et al. | 257/192 |
| 2008/0230806 A1* | 9/2008 | Pan et al. | 257/195 |
| 2008/0296624 A1* | 12/2008 | Murayama et al. | 257/197 |

\* cited by examiner

HETEROGENEOUS INTEGRATED CIRCUITS AND DEVICES THEREOF WITH A SURROGATE SUBSTRATE AND TRANSFERRED SEMICONDUCTOR DEVICES

CROSS REFERENCE TO RELATED APPLICATION

This application is a divisional of U.S. patent application Ser. No. 12/365,112, filed Feb. 3, 2009 now U.S. Pat. No. 7,972,936.

FIELD OF THE INVENTION

The present invention relates to the field of integrated circuits, and more particularly, to a method of fabrication of heterogeneous integrated circuits and devices thereof.

BACKGROUND OF THE INVENTION

Conventional integrated circuits tend to be composed of devices from the same semiconductor family. In many cases, the active components of the devices are made from the same epitaxially-deposited layers. In some cases of heterogeneous integrated circuits, the integration of the dissimilar semiconductor devices is performed off-chip as part of packaging, rather than as part of the integrated circuit fabrication. One reason is that the size of the devices precludes direct mechanical manipulation. As a result, the scale of integration that can be achieved with the off-chip approach is reduced due to the decreased density of the heterogeneous circuit elements as compared to on-chip integration. In addition, achieving interconnection speeds comparable to those speeds that can be achieved when integration is performed through an on-chip fabrication process can be extremely difficult.

In other heterogeneous integrated circuits, dissimilar semiconductor devices are integrated by growing the device material layers on top of one another. This approach is limited to device materials that are compatible to epitaxial overgrowth otherwise high defect levels lead to poor material quality and device performance. In addition, even for epitaxial compatible device materials, this approach tends to result in topology problems leading to degradation in material quality as the thickness of the layers increases. Uneven device heights complicate interconnections because interconnection with metal layers works best when the metal layer is deposited on a planar surface. In addition, inactive device layers below or above an active device impede thermal conduction of generated waste heat and can also have a deleterious effect on device performance due to parasitics.

One exemplary prior art technique of integrating heterogeneous devices at the transistor or device level illustrates the interconnection and thermal problems associated with the prior art technique. In this technique, epitaxially grown devices are built on a first growth substrate. Other epitaxial device layers are grown on a second growth substrate in such a way that an inverted stack of device layers can be bonded on top of the devices on the first growth substrate by essentially flipping the second growth substrate over and sandwiching the device with the added epitaxial layers between the first and second growth substrates. The second growth substrate is removed to expose the added epitaxial device layers. The next step would be to process the epitaxial layers into the other desired devices. This may result in some devices on the first growth substrate having an epitaxially grown other device bonded on top and some devices that do not. A thermal problem arises in that the heat from an epitaxially grown other device has to pass through the device below before it can be dissipated through the substrate.

Furthermore, the interconnection problem arises because in processing the epitaxially grown layers on top of the devices, some devices may be intentionally left without an epitaxially grown device on top. The result is an uneven surface that has to be planarized before interconnections can be made. An essential step in the planarization process is to etch or drill via holes through the planarization layer that allows interconnection to the devices. However, these planarization steps increase the complexity and cost of fabrication and the chances of failure.

Another exemplary prior art technique of integrating heterogeneous devices at the transistor or device level to build a heterogeneous integrated circuit further illustrates the thermal problems associated with the prior art technique. According to this technique, epitaxial grown devices are built on a first growth substrate. In the device building process, various planarization layers are incorporated around the device structures to facilitate electrical contacts to the active device regions (i.e. emitter, base, collector) and for interconnecting different devices into circuit elements. Other epitaxial device layers are grown on a second growth substrate in such a way that an inverted stack of device layers can be bonded on top of the devices built on the first growth substrate. The bonding process essentially flips the inverted epitaxial layers and sandwiches the devices of the first substrate and the flipped expitaxial devices layers between the first and second growth substrates. Next, the second growth substrate is removed revealing the bottom of the flipped epitaxial device layers. The expitaxial device layers in this configuration are in a normal orientation (i.e. emitter up). In the next step, a second set of devices is built from the flipped epitaxial device layers. In the device building process, various planarization layers are incorporated around the device structures to facilitate electrical contacts to the active device regions (i.e. emitter, base, collector) and for interconnecting devices from the first and second sets of devices into a heterogeneous integrated circuit. This results in devices from the second epitaxial layers to be position on top of devices from the first epitaxial layers or on planarization layers. A thermal problem arises in that heat from the second epitaxial grown devices must pass through the first epitaxial grown devices or planarization layers before it can be dissipated through the substrate.

Therefore, new methods of fabrication of heterogeneous integration circuits, and corresponding devices, are desired that minimize interconnection problems and maintain desirable thermal properties.

SUMMARY OF THE INVENTION

Embodiments of the present invention provide a heterogeneous integrated circuit on a single substrate and method for fabricating the same. Different semiconductor devices or circuit components are first grown on different substrates. The different substrates are subsequently aligned and bonded to form the heterogeneous integrated circuit. One of the two different substrates is removed leaving all devices or circuits on a single substrate.

According to an embodiment of the present invention, an integrated circuit includes a surrogate substrate including a material selected from the group consisting of Group II, Group III, Group IV, Group V, and Group VI materials and their combinations; at least one active semiconductor device including a material combination selected from the group consisting of Group IV-IV, Group III-V and Group II-VI materials; and at least one transferred semiconductor device including a material combination selected from the group consisting of Group IV-IV, Group III-V and Group II-VI materials. The at least one active semiconductor device and the at least one transferred device are interconnected.

According to an embodiment of the present invention, a method of fabricating a heterogeneous integrated circuit is provided. A first device of the heterogeneous integrated circuit is fully or partially fabricated in a first epitaxial layer set on a first substrate. A second substrate having a second epitaxial layer set on the second substrate is provided. A cavity is formed in the second epitaxial layer set, and the cavity corresponds to the first device on the first substrate. The first substrate is bonded to the second substrate such that the cavity of the second substrate receives the first device from the first substrate. The second substrate is removed, and a second device of the heterogeneous integrated circuit is fabricated in the second epitaxial layer set.

At least one etch stop layer may be formed on the second substrate such that the at least one etch stop layer is between the second substrate and the second epitaxial layer set.

The at least one etch stop layer and the first and second devices, the surrogate substrate and the bonding layer may have different etching characteristics.

The at least one etch stop layer may be removed prior to fabricating the second device.

The first epitaxial layer set and the second epitaxial layer set may be planarized.

The first device of the heterogeneous integrated circuit may be connected to the second device of the heterogeneous integrated circuit.

The first epitaxial layer set and the second epitaxial layer set each may include a plurality of device layers, and the second epitaxial layer set may have a layering order that is complimentary to a layering order of the first epitaxial layer set after bonding.

The second epitaxial layer set may include at least one spacer layer to ensure sufficient recepticle cavity depth.

The first device of the heterogeneous integrated circuit may include a material combination selected from the group consisting of Group IV-IV, Group III-V and Group II-VI materials. The first device of the heterogeneous integrated circuit may include a device selected from the material group consisting of GaN and AlGaN. The second device of the heterogeneous integrated circuit may include a material combination selected from the group consisting of Group IV-IV, Group III-V and Group II-VI materials. The second device of the heterogeneous integrated circuit may include a device selected from the material group consisting of InGaAs, InAlAs and InP.

The first device of the heterogeneous integrated circuit may include a heterostructure field effect transistor, and the second device of the heterogeneous integrated circuit may include a heterojunction bipolar transistor.

The first device may have a device structure that is substantially different from a device structure of the second device.

The bonding may be a direct bonding by utilizing a thin oxide.

One or more defects may be removed from an external layer of the second epitaxial layer set prior to the bonding, the external layer being distal from the second substrate.

According to another embodiment of the present invention, a method of fabricating an integrated circuit is provided. A heterostructure field effect transistor (HFET) device is fabricated on a surrogate substrate. An epitaxial layer set is formed on a temporary substrate. A cavity is formed in the epitaxial layer set. The cavity is configured to receive the HFET device. The surrogate substrate and the temporary substrate are bonded together such that the cavity receives the HFET device. The temporary substrate is removed. A heterojunction bipolar transistor (HBT) device is fabricated in the epitaxial layer set. The HFET device and the HBT device are connected together to form the integrated circuit.

The integrated circuit may have a cascode circuit configuration.

Defects may be removed from an external layer of the epitaxial layer set prior to the bonding. The external layer is distal to the temporary substrate.

The surrogate substrate may include a material selected from the group consisting of Si, InP, GaAs, SiC, $Al_2O_3$, GaSb, AlN, GaN, InAs and diamond.

The temporary substrate may include indium phosphide.

The HFET device may include a nitride based HFET device. The nitride based HFET device may include a device selected from the group consisting of a GaN device and an AlGaN device.

The HBT device may include an indium phosphide based HBT device. The HBT device may include a device selected from the material group consisting of InGaAs, InAlAs and InP.

DETAILED DESCRIPTION OF EMBODIMENTS OF THE INVENTION

Figure 1A:
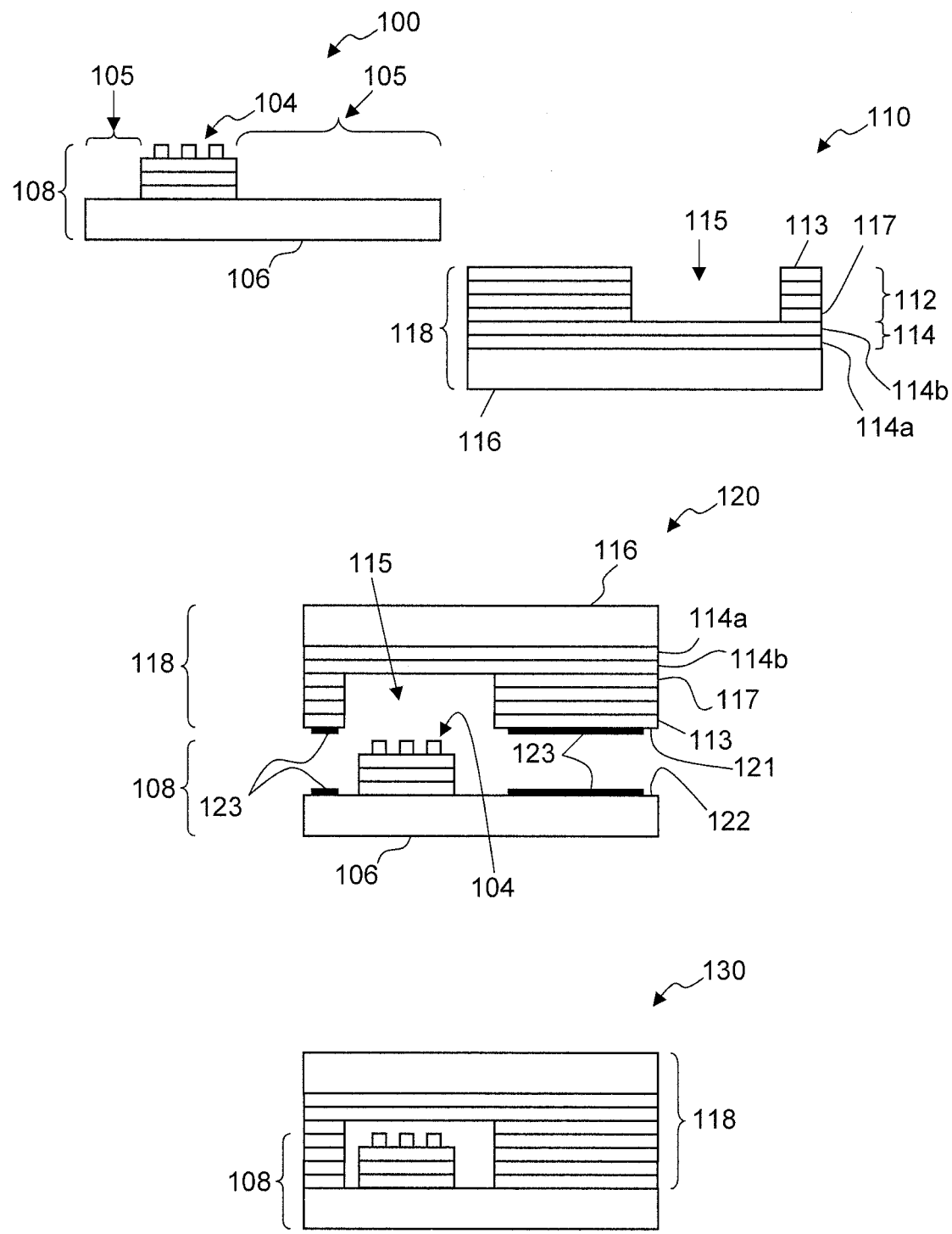
FIGS. 1a and 1b illustrate partial views of an embodiment of a process of fabrication of a heterogeneous integrated circuit in accordance with the present invention.
Figure 1B:
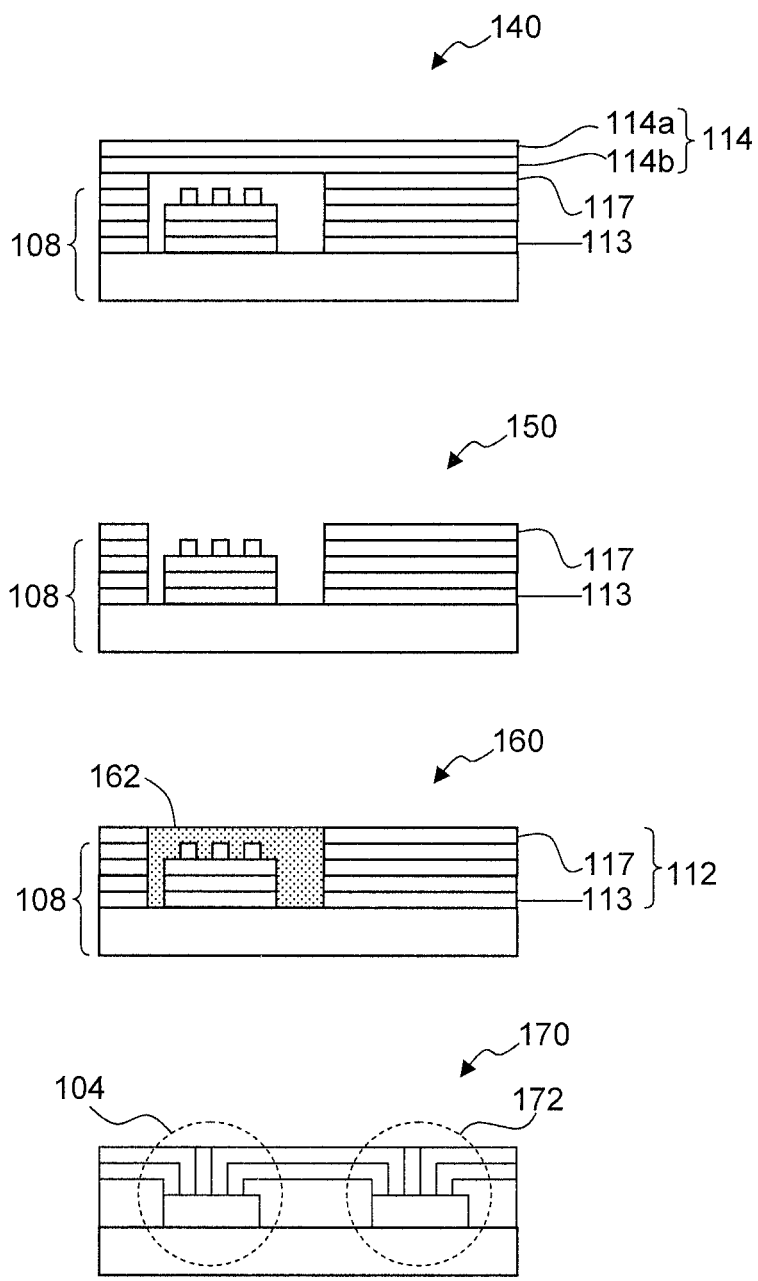

FIGS. 1a and 1b illustrate an embodiment of a process of fabrication of a heterogeneous integrated circuit in accordance with the present invention.

Referring to FIG. 1a, in step 100, a surrogate wafer 108 is formed of a surrogate substrate 106 with one or more (e.g., devices of the heterogeneous integrated circuit) fabricated from a first set of epitaxial layers composed of a first set of device layers grown on the surrogate substrate 106.

The surrogate substrate 106 may be composed of any number of suitable materials. In some embodiments, the surrogate substrate 106 is composed of sapphire, silicon carbide, aluminum nitride, diamond or the like. The choice of material for the surrogate substrate 106 depends on one or more of the following criteria: 1) quality of epitaxially grown material thereon; 2) thermal conductivity of the resulting substrate; 3) ease of removing epitaxially grown material or layers while leaving a clean/smooth surface for bonding; 4) matching of coefficient of thermal expansion to that of a temporary growth substrate (to be described below in more detail), and 5) use of transferred and bonded devices to the surrogate substrate. In addition, the choice of material for the surrogate (or final) substrate and for the temporary growth substrate depends on the device process conditions (e.g., temperature/chemical exposure). For example, the GaN/AlGaN process requires a process temperature at which InGaAs/InAlAs/InP devices cannot survive without damage.

The first set of device layers that are fabricated into one or more devices 104 (e.g., device of the heterogeneous integrated circuit) may be any suitable layers used for fabricating a desired device. In one exemplary embodiment, the first set of device layers include gallium nitride layers and aluminum gallium nitride layers grown on the surrogate substrate 106. The first set of device layers may be fabricated into one or more GaN/AlGaN devices.

After the first set of device layers are grown on the surrogate substrate 106, a portion of the first set of device layers is removed from selected regions 105 of the surrogate substrate 106. All of the first set of device layers can be removed in the selected regions 105 of the surrogate substrate 106. The first set of device layers may be removed before or after partial or full device process to form the one or more devices 104. The portion of the first set of device layers is removed from the location on which one or more second devices will be placed on the surrogated substrate 106. The second devices may be dissimilar from the devices 104. The surrogate wafer 108 is patterned with the one or more devices 104 isolated down to the surrogate substrate 106.

In one embodiment, the patterning may be performed by standard photolithography and etching well known to those of ordinary skill in the art.

The following TABLE 1 presents some exemplary combinations of surrogate substrate 106, epitaxially grown semiconductor device 104 materials and transferred semiconductor device materials. The semiconductor device 104 materials are suitably selected depending on the surrogate substrate 106 material because the semiconductor device 104 materials should be lattice matched to the surrogate substrate 106 material. However, in some embodiments, when the semiconductor device 104 is bonded to the surrogate substrate 106, then the semiconductor device 104 material is not required to be lattice matched to the surrogate substrate 106 material. Furthermore, the present invention is not limited to the examples set forth below.

In TABLE 1, the Group designations refer to groups in the Periodic Table of Elements. Typical semiconductor devices that may be constructed of these materials, without an implied limitation, include HBTs, HFETs, resonant tunneling Diodes, and FETs.

TABLE 1

| Surrogate Substrate Materials | Epitaxially Grown Semiconductor Device 104 Materials and Examples | Transferred Device Materials and Examples |
|---|---|---|
| Si | Group IV-IV: Si, SiGe Group III-V: GaN, AlGaN | Group III-V: InP, InGaAsP, GaAs, AlGaAsP, InGaAs, |
| InP | Group III-V: InP, InGaAsP, InAlAsP | InGaP, InGaAsP, InAlAsP, GaSb, InAs, AlSb, AlGaSb, AlGaAsP |
| GaAs | Group III-V: GaAs, AlGaAsP, InGaAsP | Group IV-IV: Si, SiGe |

TABLE 1-continued

| Surrogate Substrate Materials | Epitaxially Grown Semiconductor Device 104 Materials and Examples | Transferred Device Materials and Examples |
|---|---|---|
| SiC | Group III-V: GaN, AlGaN | Group II-VI: HgCdTe, ZnSe, CdZnTeSe, CdZnS, ZnS, CdTe, ZnTe, CdSe |
| Al$_2$O$_3$ (Sapphire) | Group III-V: GaN, AlGaN | |
| GaSb | Group III-V: InAs, GaSb, AlSb, AlGaSb | |
| InAs | Group III-V: InAs, GaSb, AlSb, AlGaSb | |
| AlN | All of the above via bonding | |
| Diamond | | |

The one or more devices 104 may be any of a number of semiconductor devices such as various types of diodes and transistors. Non-limiting examples of the transistors include bipolar transistors, field effect transistors, high electron mobility transistors (HEMT) and heterostructure field effect transistors (HFET) and two terminal resonant tunneling diodes. In one embodiment, the one or more devices 104 are HFETs. TABLE 1 illustrates some non-limiting exemplary materials that may be used to constitute the HFETs. In other embodiments, however, other types of devices may be fabricated on the surrogate substrate 106. In one embodiment, the HFETs are GaN/AlGaN HFETs. The one or more devices 104 may be fabricated on the surrogate substrate 106 according to any suitable processes well known to those of ordinary skill in the art.

In one embodiment, the fabrication of the heterogeneous integrated circuit composed of GaN/AlGaN HFETs and InP-based HBTs or GaAs-based HBTs is disclosed as follows.

In step 110, a temporary growth wafer 118 is formed of a temporary growth substrate 116, etch stop layer(s) 114 formed on the temporary growth substrate 116 and one or more epitaxial layers 112 formed on the etch stop layer(s) 114.

In one embodiment, the temporary growth substrate 116 is composed of any suitable material that allows high-performance device layers to be grown on the substrate. In other embodiments, the temporary growth substrate 116 is composed of any suitable material that results in a suitably small number of defects on an external surface of the one or more epitaxial layers 112. In various embodiments, the temporary growth substrate 116 may be composed substantially of indium phosphide (InP), gallium arsenide (GaAs) or the like, but the present invention is not limited thereto.

The etch stop layer(s) 114 is formed on the temporary growth substrate 116. In one embodiment, the etch stop layer(s) 114 include two etch stop layers 114a and 114b. The etch stop layer 114a may be formed on the surrogate substrate, and the etch stop layer 114b may be formed on the etch stop layer 114a, and vice versa.

One skilled in the art would appreciate that the etch stop layer 114a may be composed of any suitable material having properties that prevent (or stop) an etching process applied to the temporary growth substrate 116 from etching into the etch stop layer 114a. One skilled in the art would also appreciate that the etch stop layer 114b may be composed of any suitable material having properties that prevent (or stop) an etching process applied to the etch stop layer 114a from etching into the one or more epitaxial layers 112 and 108 (106 and 104) or 123. Suitable etch stop layer compositions and etching processes are well known to those of ordinary skill in the art.

In one embodiment, the etch stop layer 114a is composed of a material having substantially different etching characteristics from that of the temporary growth substrate 116. In one embodiment, the etch stop layer 114b is composed of a material having substantially different etching characteristics from that of the etch stop layer 114a.

In another embodiment, the etch stop layer 114a is composed of InGaAs, the temporary growth substrate 116 is composed of InP, and the etch stop layer 114b is composed of InP.

The one or more epitaxial layers 112 are formed of one or more device layers epitaxially grown on the one or more etch stop layers 114. In one embodiment, the one or more device layers may be composed of material allowing the layers to be fabricated into one or more devices that are substantially different from the one or more devices 104. In another embodiment, the one or more device layers may be composed of material allowing the layers to be fabricated into one or more devices that are substantially similar to the one or more devices 104.

In one embodiment, a bottommost device layer 117 of the one or more epitaxial layers 112 is grown on the etch stop layer 114b. The device layers are grown prior to any device lithography and are grown in a reverse order or inverted order. Accordingly, a device layer that would typically be grown closest to the temporary growth substrate 116 for fabrication is grown furthest from the temporary growth substrate 116 while a layer that would typically be grown furthest from the substrate 116 is grown closest to the substrate 116. As used herein, an external layer of the one or more epitaxial layers 112 shall be referred to as an "external device layer." In this embodiment, an external device layer 113 is grown furthest from the substrate 116 while the bottommost layer 117 is grown closest to the substrate 116.

In some embodiments, the one or more epitaxial layers 112 are grown to a height of about 1.5 µm. In some embodiments, the device layers of the one or more epitaxial layers 112 are layers composed of materials for fabricating one or more InGaAs devices. In other embodiments, the device layers may be composed of other materials for fabricating semiconductor devices of other materials. Additionally, in one embodiment, the device layers are fabricated into one or more HBTs. However, the device layers may be fabricated into any of a number of semiconductor device types.

In some embodiments, a spacer layer is incorporated into the one or more epitaxial layers 112 to ensure that the height of the one or more epitaxial layers 112 and the height of the one or more devices 104 are substantially equal.

A cavity 115 is formed in a portion of the one or more epitaxial layers 112 while the etch stop layer(s) 114 are left substantially intact. In one embodiment, the cavity 115 is formed such that a portion of the one or more epitaxial layers 112 flanks the cavity 115 to the left and to the right of walls of the cavity 115. Those skilled in the art would appreciate that more than one cavity 115 may be formed.

The cavity 115 may be formed through any suitable methods well known to those skilled in the art for forming cavities in the one or more epitaxial layers 112. In one embodiment, the portion of the one or more epitaxial layers 112 at which the cavity 115 is located is complementary to the location at which the one or more devices 104 on the surrogate substrate 106 are located. Further, the cavity 115 is dimensioned to provide a recess for receiving the one or more devices 104. For example, the depth of the cavity 115 is larger than the height of the one or more devices 104 on the substrate 106.

In one embodiment, to form the cavity 115, a complementary pattern is formed in the device layers of the one or more epitaxial layers 112, and the material of the device layers is removed from a space to be occupied by the one or more devices 104.

In step 120, the temporary growth wafer 118 is oriented such that a topmost surface 121 of the external device layer 113 is substantially parallel and above the topmost surface 122 of the substrate 106. The wafer 118 is also aligned with the wafer 108 such that the cavity 115 is positioned to receive the one or more devices 104. In some embodiments, alignment marks may be fabricated on the substrate 106 to facilitate alignment between the wafer 118 and the wafer 108.

The surfaces 121 and 122 are prepared to receive a bonding material on a portion of each of the surfaces 121 and 122. In one embodiment, the surfaces 121 and 122 are prepared by oxygen plasma exposure to each surface. A thin layer of bonding material 123 (e.g., a thin oxide layer) is formed on the surfaces 121 and 122.

The thin oxide layer may be a plasma-formed thin oxide layer. In one embodiment, the bonding material 123 is a thin oxide applied to a height of about 50 Å. Since the bonding material 123 is applied at a height that is only a few atomic layers thick, in most cases, the bonding material 123 does not create a sizeable thermal resistance. Therefore, the surface 121 is bonded to the surface 122 of the surrogate substrate 106 while there is a relatively good thermal conduction through the surrogate substrate 106.

In some embodiments, the bonding material 123 is applied to cover sufficient areas of the surfaces 121 and 122 such that the bond between the surfaces 121 and 122 is substantially maintained upon removal of the temporary growth substrate 116 by, for example, lapping and polishing.

The combined height of the etch stop layer(s) 114 and the one or more epitaxial layers 112 is designed such that the surfaces 121 and 122 can be bonded together while substantially receiving the one or more devices 104 in the cavity 115.

In some embodiments, the one or more devices 104 and the one or more epitaxial layers 112 are patterned such that the surfaces 121 and 122 can be bonded together while avoiding bonding within a certain perimeter of the one or more devices 104. In one embodiment, the perimeter is about 10 µm.

In one embodiment, the patterning may be performed by standard photolithography and etching known to those of ordinary skill in the art.

In step 130, the wafers 118 and 108 are bonded together by bringing the bonding material 123 coating a portion of the surfaces 121 and 122 into contact such that the one or more devices 104 are aligned with the cavity 115. After bonding, devices (e.g., heterogeneous devices) may be fabricated from the one or more epitaxial layers 112 on the surrogate substrate 106.

The wafers 118 and 108 may be aligned in a bond fixture, to form structure 130, using an EV Group Wafer Alignment System (601) and bonded in an EV Group (520) Wafer Bonding System at a temperature less than 150° C. In various embodiments, a typical surface energy for the bonded pair is about 500 mJ/m² after bonding.

Referring to FIG. 1b, in step 140, the temporary growth substrate 116 is removed. The oxide-oxide bond is sufficiently strong to withstand removal of the temporary growth substrate 116, for example, by mechanical lapping and polishing. In one embodiment, the substrate 116 is removed using lapping and polishing followed by standard selective wet etching processes. The lapping and polishing as well as the standard selective wet etching processes are each well known to those skilled in the art.

In one embodiment, the substrate 116 is lapped and polished down to about 150 μm thick, and a chemical etching process is applied to etch away the remaining substrate 116. In one embodiment, the etching solution is a hydrochloric acid-based solution.

In step 150, the etch stop layer(s) 114 are removed. First, the etch stop layer 114a is removed by using etching processes known to those of ordinary skill in the art. In one embodiment, the etch stop layer 114a is removed by using a citric acid wet etch. Next, the etch stop layer 114b is removed. In one embodiment, the etch stop layer 114b is removed using a brief dry etch methane-based inductively coupled plasma process. The etch stop layer 114b can be removed without substantially harming the one or more epitaxial layers 112.

In step 160, a planarization layer (e.g., a spin-on-glass layer) 162 is applied to the one or more devices 104 and the one or more epitaxial layers 112 to planarize the device layers of the one or more epitaxial layers 112 and the one or more devices 104. The planarization layer 162 is also applied to protect the bonding interface formed where the surfaces 121 and 122 were brought into contact with one another. The planarization layer 162 is etched away so that the one or more epitaxial layers 112 are exposed but any spaces between the one or more devices 104 and the one or more epitaxial layers 112 remain filled. Any spacer layer that might have been part of the one or more epitaxial layers 112 is removed. The planarization layer 162 may be etched further to bring it to the level of the device layers of the one or more epitaxial layers 112.

In step 170, the device layers of the one or more epitaxial layers 112 are fabricated into one or more devices 172 (e.g., devices of the heterogeneous integrated circuit) by methods well known to those of ordinary skill in the art, and the devices 104 and 172 are interconnected to form an integrated circuit. In one embodiment, the one or more devices 172 are HBT type transistors composed of materials such as InGaAs, InAlAs or InP. In other embodiments, the one or more devices 172 may belong to a device type that is different from an HBT. In one embodiment, one or more InGaAs HBT devices and one or more GaN/AlGaN HFET devices are fabricated on the common surrogate substrate 106. The one or more devices 172 and the one or more devices 104 are interconnected using, for example, standard photolithographic and metallization techniques to form a heterogeneous integrated circuit. The embodiment shown in FIGS. 1a and 1b provides a method to fabricate devices having different temperature processing requirement. For example, the devices 172 may have a higher processing temperature requirement than that of the devices 104.

Figure 2A:
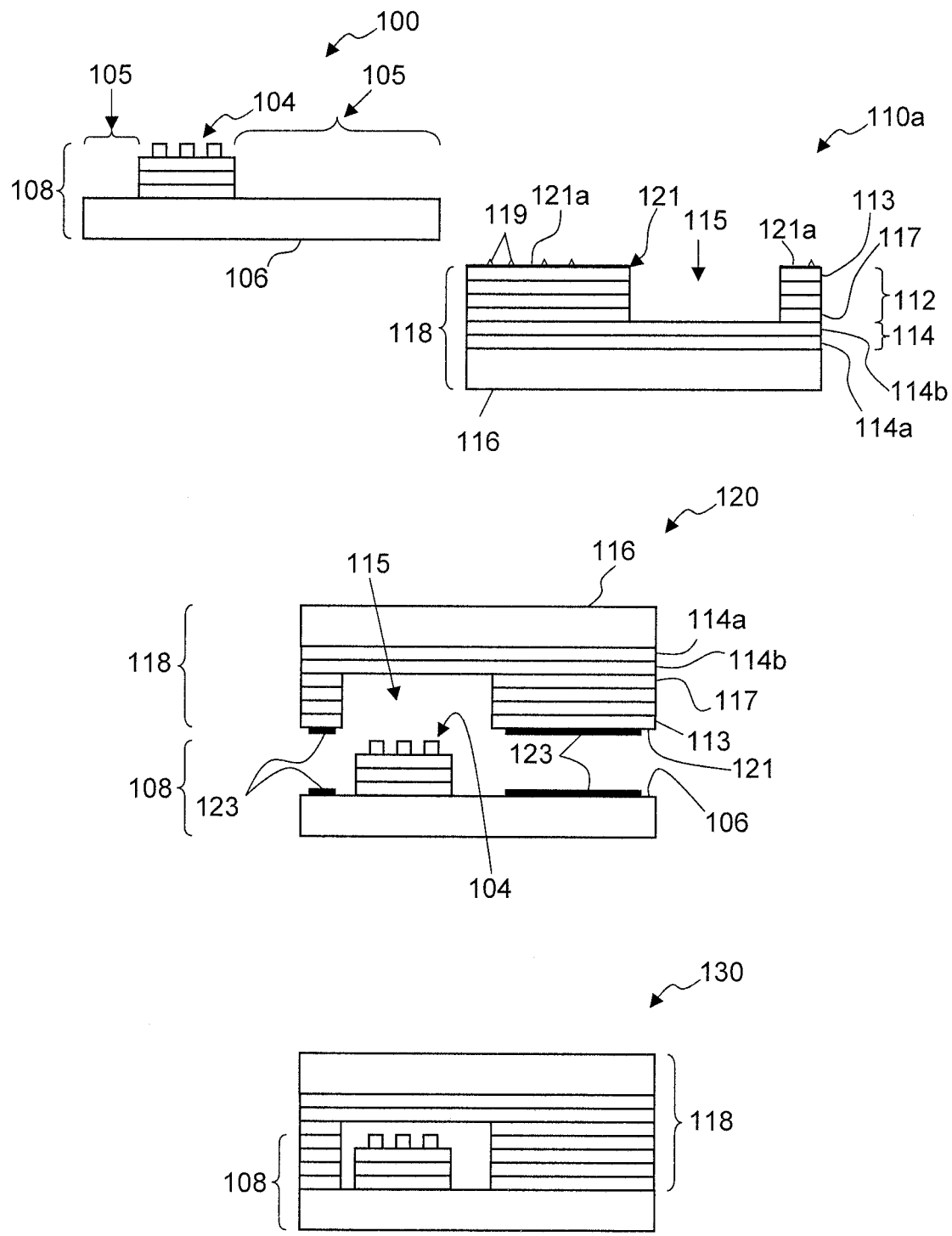
FIGS. 2a and 2b illustrate partial views of an embodiment of a process of fabrication of a heterogeneous integrated circuit incorporating defect removal in accordance with the present invention.
Figure 2B:
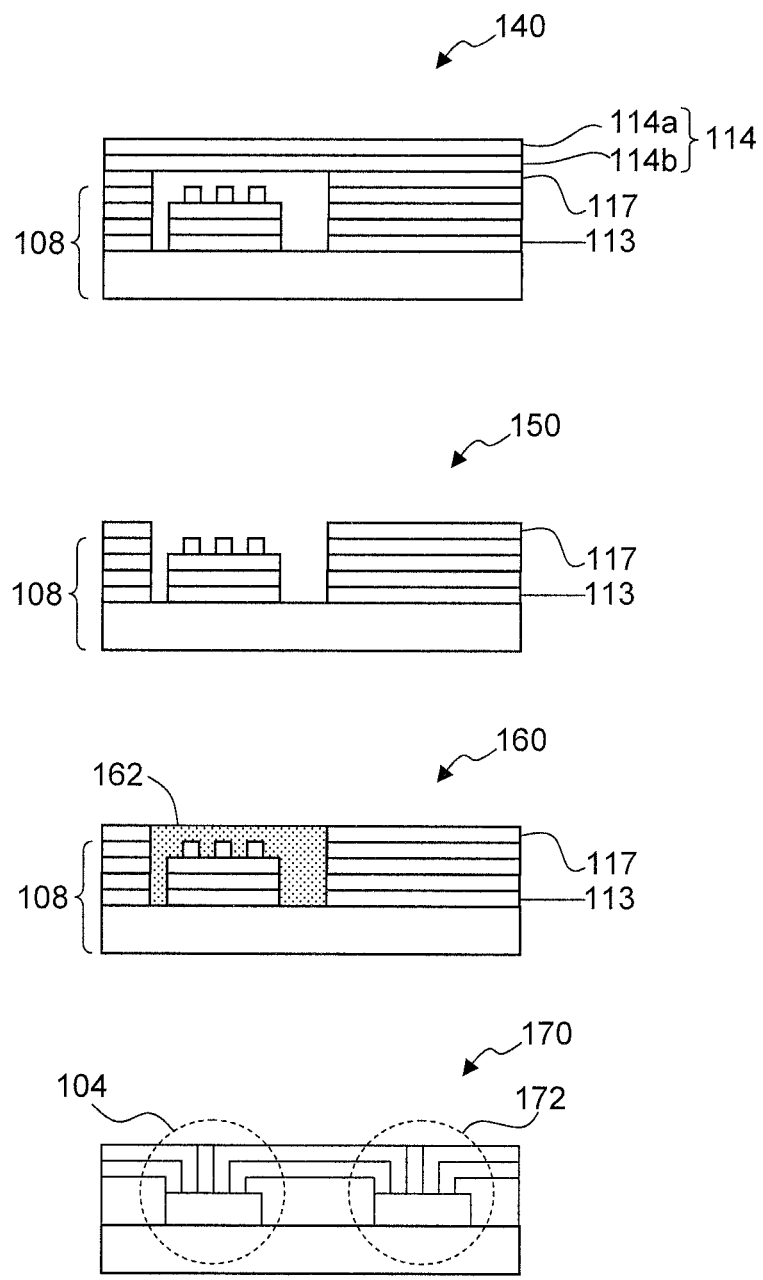

FIGS. 2a and 2b illustrate an embodiment of a process of fabrication of a heterogeneous integrated circuit incorporating defect removal in accordance with the present invention. In this embodiment, a defect removal method such as that described in "Self-Masking Defect Removing Method," United States Patent Application Publication No. 2005/0186800, Ser. No. 10/787,276, and incorporated by reference herein in its entirety, may be performed.

FIGS. 2a and 2b include steps 100, 120, 130, 140, 150, 160 and 170 shown and described with reference to FIGS. 1a and 1b. However, the defect removal method is performed at step 110a, which occurs after step 100 and prior to step 120.

The defect removal method illustrated in step 110a may be performed to remove defects 119 on the surface 121. The defect removal method may increase a bond yield between the bonded surfaces 121 and 122. Protruding defects 119 such as oval defects or metal spits may occur on the surface 121 due to morphological characteristics of the device layers of the one or more epitaxial layers 112. In one embodiment, using the defect removal method illustrated in step 110a results in a high bond yield of about 95%.

In one embodiment, the defect removal method illustrated in step 110a is performed as follows. The surface 121 is coated with a protective layer 121a, which is later thinned to selectively reveal portions of the protruding defects 119. In some embodiments, the protective layer 121a is a photoresist layer applied to a thickness of about 5-10 μm. In other embodiments, the photoresist layer is applied to a thickness of about 1000 to about 6000 Å. In some embodiments, the protective layer 121a may be silicon oxide, silicon nitride or the like. In some embodiments, the protective layer 121a is deposited by using plasma enhanced chemical vapor deposition (PECVD).

The defects 119 may be removed by etching. In some embodiments, the defects 119 are removed using a wet chemical etchant such as citric acid, hydrochloric acid or acetic acid. In other embodiments, the defects 119 are removed using a chemical etchant such as a potassium hydroxide, water, isopropyl alcohol additive solution; an ethylene diamine pyrocathecol, water, pyrazine additive solution; a tetramethyl ammonium hydroxide, water solution; or a hydrazine water, isopropyl alcohol solution, among other solutions.

Finally, the protective layer 121a is removed. According to the method illustrated in step 110a, inadvertent thinning of the surface 121 may be prevented and removal of the defects 119 is obtained. In some embodiments, thinning is performed by buffered oxide etching, electron cyclotron resonance, reactive ion etching, and/or other suitable techniques.

Figure 3:
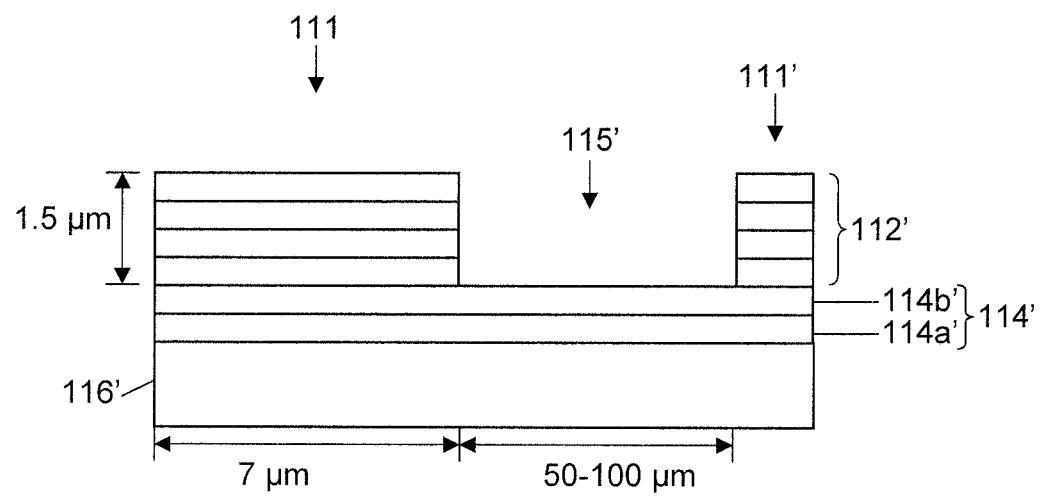
FIG. 3 illustrates a cross-sectional view of an embodiment of a temporary growth wafer in accordance with the present invention.

FIG. 3 is a cross-sectional view of an embodiment of a temporary growth wafer formed through step 100 of FIG. 1a or step 110a of FIG. 2a in accordance with the present invention. In one embodiment, a cavity 115' is formed in a region of one or more epitaxial layers 112' to create a majority portion 111 of the region and a minority portion 111' of the region.

In one embodiment, the cavities 115 and 115' are shown and described as a rectangular shape, in other embodiments, the cavities 115 and 115' could be designed as other suitable shapes, such as a square or circular shape.

The dimensions of the embodiment shown in FIG. 3 are not shown in actual proportion, but are exaggerated for ease of description. The cavity 115' has a height of about 1.5 μm and a width of about 50 to about 100 μm. Additionally, the one or more epitaxial layers 112' have a height of about 1.5 μm. The portions 111 and 111' have widths of greater than about 7 μm. A temporary growth substrate 116' may be composed of InP. An etch stop layer 114a', which is formed on the substrate 116' may be composed of InGaAs, and an etch stop layer 114b', which is formed on the etch stop layer 114a', may be composed of InP.

A wet hydrochloric acid-based etch is applied to the substrate 116'. A wet etch such as citric acid is applied to the layer 114a' to etch the layer 114a'. A dry etch is applied to the layer 114b' to etch the layer 114b'.

Figure 4:
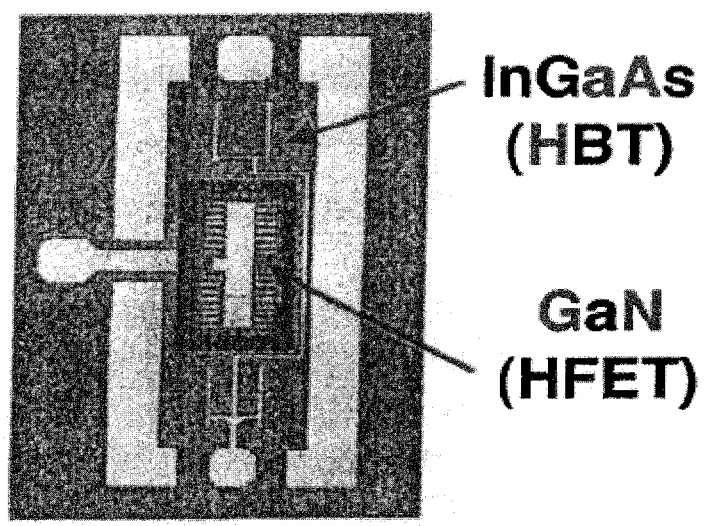
FIG. 4 illustrates a top view of an embodiment of an indium gallium arsenide (InGaAs) heterojunction bipolar transistor (HBT) and gallium nitride/aluminum gallium nitride (GaN/AlGaN) heterostructure field effect transistor (HFET) power amplifier circuit having a cascode circuit configuration.

FIG. 4 illustrates a top plan view of an InGaAs HBT and GaN/AlGaN HFET power amplifier integrated circuit in a cascode circuit configuration according to an embodiment of the present invention. The power amplifier integrated circuit is composed of a GaN/AlGaN HFET and an InGaAs HBT on a sapphire surrogate substrate. FIG. 4 may be fabricated according to the processes illustrated in FIGS. 1a and 1b or according to the processes illustrated in FIGS. 2a and 2b.

Although certain diagrams provided herein show a specific order of method steps, those skilled in the art would appreciate that the order of these steps may differ from what is depicted. Also, two or more steps may be performed concurrently or with partial concurrence.

Although certain exemplary embodiments of the present invention have been disclosed for illustrative purposes, those skilled in the art will appreciate that various modifications, additions and substitutions are possible, without departing from the scope and spirit of the present invention as disclosed in the accompanying claims and their equivalents.

What is claimed is:

1. An integrated circuit comprising:
a surrogate substrate comprising a material selected from the group consisting of Group II, Group III, Group IV, Group V, Group VI materials and their combinations;
at least one epitaxially grown semiconductor device epitaxially grown from a topmost planar surface of the surrogate substrate and comprising a material combination selected from the group consisting of Group IV-IV, Group III-V and Group II-VI materials; and
at least one transferred semiconductor device transferred onto the topmost planar surface of the surrogate substrate, not epitaxially grown from the surrogate substrate and comprising a material combination selected from the group consisting of Group IV-IV, Group III-V and Group II-VI materials,
wherein the at least one epitaxially grown semiconductor device and the at least one transferred device are interconnected on the surrogate substrate.

2. The integrated circuit of claim 1, wherein the surrogate substrate has a growth region and a bonding region, wherein the at least one epitaxially grown semiconductor device is epitaxially grown on the growth region of the surrogate substrate, and wherein the at least one transferred semiconductor device is transferred and bonded to the bonding region of the surrogate substrate.

3. An integrated circuit comprising:
a surrogate substrate comprising a material selected from the group consisting of Group II, Group III, Group IV, Group V, Group VI materials and their combinations;
at least one epitaxially grown semiconductor device epitaxially grown from a topmost planar surface of the surrogate substrate, the at least one epitaxially grown semiconductor device comprising a material combination selected from the group consisting of Group IV-IV, Group III-V and Group II-VI materials; and
at least one transferred semiconductor device transferred onto the topmost planar surface of the surrogate substrate, the at least one transferred semiconductor device comprising a material combination selected from the group consisting of Group IV-IV, Group III-V and Group II-VI materials,
wherein the at least one epitaxially grown semiconductor device and the at least one transferred device are interconnected on the surrogate substrate, and wherein the at least one epitaxially grown semiconductor device is lattice matched to the surrogate substrate, and the at least one transferred semiconductor device is not lattice matched to the surrogate substrate.

4. The integrated circuit of claim 3, wherein the at least one epitaxially grown semiconductor device comprises epitaxially grown layers epitaxially grown on the surrogate substrate.

5. The integrated circuit of claim 3, wherein the at least one transferred semiconductor device comprises epitaxially grown layers epitaxially grown on a temporary growth substrate.

6. The integrated circuit of claim 3, wherein the at least one epitaxially grown semiconductor device is bonded to the surrogate substrate.

7. The integrated circuit of claim 3, wherein the at least one epitaxially grown semiconductor device comprises a heterostructure field effect transistor (HFET) device.

8. The integrated Circuit of claim 7, wherein the HFET device comprises a nitride based HFET device.

9. The integrated circuit of claim 8, wherein the nitride based HFET device comprises a device selected from the group consisting of a GaN device and an AlGaN device.

10. The integrated circuit of claim 3, wherein the at least one transferred semiconductor device comprises a heterojunction bipolar transistor (HBT) device.

11. The integrated circuit of claim 10, wherein the HBT device comprises an indium phosphide based HBT device.

12. The integrated circuit of claim 11, wherein the indium phosphide based HBT device comprises a device selected: from the group consisting of an InGaAs device, an InAlAs device and an InP device.

13. The integrated circuit of claim 3, wherein the surrogate substrate comprises a material selected from the group consisting of Si, InP, GaAs, SiC, $Al_2O_3$, GaSb, AlN, InAs, and diamond.

14. The integrated circuit of claim 3, wherein the integrated circuit has a cascode circuit configuration.

15. The integrated circuit of claim 3, further comprising a layer of bonding material between the at least one transferred semiconductor device and the surrogate substrate, wherein the at least one epitaxially grown semiconductor device and the at least one transferred device are selected from different materials from the group consisting of Group IV-IV, Group III-V, and Group II-VI materials.

16. The integrated circuit of claim 15, wherein the layer of bonding material comprises an oxide layer.

17. The integrated circuit of claim 16, wherein the oxide layer is a plasma-formed oxide layer.

* * * * *